United States Patent
Moore et al.

(10) Patent No.: US 9,313,427 B2
(45) Date of Patent: Apr. 12, 2016

(54) IMAGE SENSOR WITH IMPROVED DYNAMIC RANGE

(71) Applicant: STMicroelectronics (R&D) Ltd, Marlow, Buckinghamshire (GB)

(72) Inventors: John Kevin Moore, Edinburgh (GB); Matthew Purcell, Edinburgh (GB); Graeme Storm, Forres (GB); Tarek Lule, Saint-Egreve (FR)

(73) Assignees: STMicroelectronics (Grenoble 2) SAS, Grenoble (FR); STMicroelectronics (Research & Development) Limited, Marlow, Buckinghamshire (GB)

(*) Notice: Subject to any disclaimer, the term of this patent is extended or adjusted under 35 U.S.C. 154(b) by 572 days.

(21) Appl. No.: 13/710,981

(22) Filed: Dec. 11, 2012

(65) Prior Publication Data

US 2013/0155239 A1    Jun. 20, 2013

(30) Foreign Application Priority Data

Dec. 15, 2011  (GB) .................................... 1121577.9
Dec. 16, 2011  (GB) .................................... 1121688.4

(51) Int. Cl.
| | |
|---|---|
| *H04N 5/369* | (2011.01) |
| *H04N 5/353* | (2011.01) |
| *H01L 27/146* | (2006.01) |
| *H04N 5/335* | (2011.01) |
| *H01L 27/148* | (2006.01) |
| *H04N 5/3745* | (2011.01) |

(Continued)

(52) U.S. Cl.
CPC ............ *H04N 5/3535* (2013.01); *H01L 27/146* (2013.01); *H01L 27/148* (2013.01); *H01L 27/14603* (2013.01); *H01L 27/14621* (2013.01); *H04N 5/335* (2013.01); *H04N 5/369* (2013.01); *H04N 5/3745* (2013.01); *H04N 9/045* (2013.01)

(58) Field of Classification Search
CPC ... H04N 5/3535; H04N 9/045; H04N 5/3745; H04N 5/335; H04N 5/369; H01L 27/14603; H01L 27/146; H01L 27/148; H01L 27/14621
USPC .............. 348/134, 161, 208.12, 221.1, 229.1, 348/362, E5.037
See application file for complete search history.

(56) References Cited

U.S. PATENT DOCUMENTS

| | | |
|---|---|---|
| 3,971,065 A | 7/1976 | Bayer |
| 5,597,997 A | 1/1997 | Obata et al. |

(Continued)

FOREIGN PATENT DOCUMENTS

GB        2425229 A     10/2006

OTHER PUBLICATIONS

UKIPO Search Report for GB1121688.4 mailed Apr. 18, 2012 (3 pages).

(Continued)

*Primary Examiner* — Hung Lam
(74) *Attorney, Agent, or Firm* — Gardere Wynne Sewell LLP

(57) ABSTRACT

An image sensor having improved dynamic range includes a signal that is read out for a selection of pixels which act as a calibration to govern the choice of exposure levels to be applied to the rest of the array. In this way, the sensor is operable to adapt to variations in scene intensity. The pixels in the array are vertically and horizontally addressed so as to enable accounted for small areas of intensity variation across an imaged scene.

14 Claims, 10 Drawing Sheets

(51) Int. Cl.
   *H04N 9/04* (2006.01)
   *H04N 5/374* (2011.01)

(56) References Cited

U.S. PATENT DOCUMENTS

| | | | |
|---|---|---|---|
| 7,750,278 B2 | 7/2010 | Oike et al. | |
| 8,675,101 B1* | 3/2014 | Linzer | H04N 5/361 |
| | | | 348/241 |
| 9,106,850 B2* | 8/2015 | Moore | H04N 5/335 |
| 2004/0227832 A1 | 11/2004 | Loose | |
| 2005/0173616 A1 | 8/2005 | Jang | |
| 2006/0021498 A1 | 2/2006 | Moroz et al. | |
| 2007/0223904 A1 | 9/2007 | Bloom et al. | |
| 2008/0079841 A1 | 4/2008 | Cieslinksi | |
| 2008/0179490 A1 | 7/2008 | Ohno et al. | |
| 2009/0127438 A1* | 5/2009 | Barbier | H04N 5/335 |
| | | | 250/208.1 |
| 2009/0160987 A1* | 6/2009 | Bechtel | H04N 5/353 |
| | | | 348/302 |
| 2009/0262215 A1 | 10/2009 | Sano et al. | |
| 2011/0221931 A1 | 9/2011 | Wakabayashi et al. | |
| 2011/0310278 A1 | 12/2011 | Bai et al. | |
| 2012/0086840 A1* | 4/2012 | Xhakoni | H04N 5/2353 |
| | | | 348/297 |
| 2013/0329128 A1* | 12/2013 | Kaizu | H04N 5/374 |
| | | | 348/367 |

OTHER PUBLICATIONS

UK Search Report for GB1121577.9 dated Apr. 13, 2012 (2 pages).
Taghmai, Sohrab: "Technology Trends and Market Opportunities for Image Sensors for Automative Market," ISE2011, London, Mar. 23, 2011 (27 pages).

* cited by examiner

IMAGE SENSOR WITH IMPROVED DYNAMIC RANGE

PRIORITY CLAIM

This application claims priority from Great Britain Application for Patent No. 1121577.9 filed Dec. 15, 2011, and from Great Britain Application for Patent No. 1121688.4 filed Dec. 16, 2011, the disclosures of which are hereby incorporated by reference.

TECHNICAL FIELD

The present invention relates to the field of digital image sensors, and in particular to the field of high dynamic range methods for such sensors which involve the combination of images or image data of differing exposures.

BACKGROUND

Digital image sensing based upon solid state technology is well known, the two most common types of image sensors currently being charge coupled devices (CCD's) and complementary metal oxide semiconductor (CMOS) image sensors. Digital image sensors are incorporated within a wide variety of devices throughout the consumer, industrial and defense sectors, among others.

An image sensor is a device comprising one or more radiation sensitive elements having an electrical property that changes when radiation is incident thereupon, together with circuitry for converting the changed electrical property into a signal. As an example, an image sensor may comprise a photodetector that generates a charge when radiation is incident thereupon. The photodetector may be designed to be sensitive to electromagnetic radiation in the range of (human) visible wavelengths, or other neighboring wavelength ranges, such as infra red or ultra violet for example. Circuitry is provided that collects and carries the charge from the radiation sensitive element for conversion to a value representing the intensity of incident radiation.

Typically, more than one radiation sensitive element will be provided in an array. The term pixel is used as a shorthand for picture element. In the context of a digital image sensor, a pixel refers to that portion of the image sensor that contributes one value representative of the radiation intensity at that point on the array. These pixel values are combined to reproduce a scene that is to be imaged by the sensor. A plurality of pixel values can be referred to collectively as image data. Pixels are usually formed on and/or within a semiconductor substrate. In fact, the radiation sensitive element comprises only a part of the pixel, and only part of the pixel's surface area (the proportion of the pixel area that the radiation sensitive element takes up is known as the fill factor). Other parts of the pixel are taken up by metallization such as transistor gates and so on. Other image sensor components, such as readout electronics, analog to digital conversion circuitry and so on may be provided at least partially as part of each pixel, depending on the pixel architecture.

Image sensors of this type may be used for still image capture and for video capture. Even when an image sensor is primarily designed for still image capture, it is common for a video function to be provided for example to provide a viewfinder function in a screen of a digital camera.

One of the most important characteristics of any image sensor is its dynamic range, that is, the ratio between the minimum and the maximum signal that can be successfully reproduced by the image sensor. There are various fields in which a high or very high dynamic range is required. An example of this is the automotive field. It is known to provide sensors of various types at various locations in or on a vehicle such as an automobile. Image sensors may be provided to perform various functions based on detection of images inside the vehicle and outside the vehicle. Examples of functions relating to detection of images inside the vehicle include driver recognition (using facial recognition), driver drowsiness detection (using head detection and object tracking), and crash recorders. Examples of functions relating to detection of images outside the vehicle include automatic parking systems, lane change assistance systems, pre-crash detection, sign recognition, headlamp control. These lists of examples are of course non-exhaustive.

For all these sensors, a high dynamic range is important due to the wide variations in the scenes that are to be imaged. A common example is driving at night time. A sensor may be designed to detect the position of a line in the center of a road, and needs to be able to detect and provide data for tracking the position of the line, but the sensor's field of view will regularly encompass objects that are very much brighter than the line that it is designed to track, for example, the illumination provided by headlights of another vehicle driving in the opposite direction to the vehicle carrying the sensor. It is important that the sensor does not become saturated by the bright headlight illumination, but also retains the ability to keep tracking the line in the center of the road, that is, it requires a very high dynamic range in order to function correctly. Another common example is a vehicle that exits a tunnel during the daytime. For the example of a sensor designed to detect the position of a line in the center of a road, a sharp transition in brightness will occur as the vehicle moves between the relative darkness of the tunnel and brightness of the daytime environment outside of the tunnel.

In addition, motion artifacts can detract from the correct operation of a sensor. This is of particular concern in the automotive field as cars may be moving at high speeds in opposite lanes towards each other.

A high dynamic range is important for all sensors in the automotive field (for functions relating to detection of images inside and outside the vehicle), and in general to image sensors in other application areas such as machine vision and consumer camera devices for example.

It is known to augment the dynamic range of an image sensor by capturing multiple images with different exposures, and then combining the data from the multiple images, for example by summing weighted pixel values, to obtain a composite image. However, these techniques are memory intensive and require that the number of pixel readouts carried out is multiplied by the number of images taken.

SUMMARY

According to a first aspect of the disclosure there is provided a method of imaging a scene with a digital image sensor comprising a pixel array comprising the steps of: performing a reset operation across one row of the pixel array; integrating pixels in said row for a first calibration time; at the end of said calibration time, reading pixel values of said row of pixels; comparing said pixel values with one or more predetermined thresholds; and setting subsequent exposure levels for pixels in the pixel array based upon said pixel values.

Optionally, said step of setting exposure levels for pixels in the pixel array comprises controlling the timing of reset signals applied to individual pixels by vertically and horizontally addressing the pixels in the pixel array.

Optionally, said step of comparing said pixel values with one or more predetermined thresholds comprises comparing the pixel values with the values of a DAC ramp, and said DAC ramp is stepped according to the one or more predetermined thresholds.

Optionally, the exposure levels which are set for pixels in the pixel array based upon said pixel values read out at the end of said calibration time are stored as decision data.

Optionally, said decision data is used to control the gain of the analog readout.

Optionally, low pass filtering is applied to successive decision data.

Optionally, only changes in decision data that apply from one pixel to another are stored.

According to a second aspect of the disclosure there is provided a digital image sensor comprising a pixel array and control circuitry arranged to perform a reset operation across one row of the pixel array; integrate pixels in said row for a first calibration time; at the end of said calibration time, read pixel values of said row of pixels; compare said pixel values with one or more predetermined thresholds; and set subsequent exposure levels for pixels in the pixel array based upon said pixel values.

Optionally, pixels within the array have a structure that comprises a photoelectric conversion device connected to a transfer gate transistor which is operable to selectively connect or disconnect the photoelectric conversion to/from the remainder of the pixel circuitry.

Optionally, pixels within the array comprise multiple transistors to enable the pixel transfer gate operation to be dependent upon two input signals.

Optionally, a first transfer gate transistor is connected to a vertical pixel address line and a second transfer gate transistor is connected to a horizontal pixel address line, such that charge will be transferred from the pinned photodiode to the floating diffusion node only when both the vertical and horizontal address lines are driven high.

Optionally, a first transfer gate transistor is connected at its gate to the source of a second transfer gate transistor, and said second transfer gate transistor is connected at its gate to a vertical address line and at its drain to a horizontal address line, so that if the vertical address line is pulled low then a reset pulse applied on the horizontal control line will not be passed to the gate of the first transistor.

According to a third aspect of the disclosure there is provided a device comprising a digital image sensor comprising a pixel array and control circuitry arranged to perform a reset operation across one row of the pixel array; integrate pixels in said row for a first calibration time; at the end of said calibration time, read pixel values of said row of pixels; compare said pixel values with one or more predetermined thresholds; and set subsequent exposure levels for pixels in the pixel array based upon said pixel values.

According to a fourth aspect of the disclosure there is provided a vehicle comprising a digital image sensor comprising a pixel array and control circuitry arranged to perform a reset operation across one row of the pixel array; integrate pixels in said row for a first calibration time; at the end of said calibration time, read pixel values of said row of pixels; compare said pixel values with one or more predetermined thresholds; and set subsequent exposure levels for pixels in the pixel array based upon said pixel values.

BRIEF DESCRIPTION OF THE DRAWINGS

Aspects of the disclosure will now be described, by way of example only, with reference to the accompanying drawings in which.

DETAILED DESCRIPTION OF THE DRAWINGS

The present disclosure relates to improvements in or relating to image sensors, in particular to new rolling blade exposure techniques to extend dynamic range in CMOS image sensors.

A solid state image sensor, such as a CMOS image sensor, comprises an array of pixels. To start a readout operation, a pixel is first reset, so that the voltage at the photodiode (or other radiation sensitive element) is driven to a predetermined reset voltage. Radiation is then incident on these pixels for an integration time, and the resulting charge is converted to a voltage before being read out. The readout process includes converting the analog voltage to a digital value and then processing the collected digital values in order to construct an image. As pixel arrays comprise a large number of pixels, it is common to read out selected subsets of pixels, for example, a row, at a time.

Figure 1:
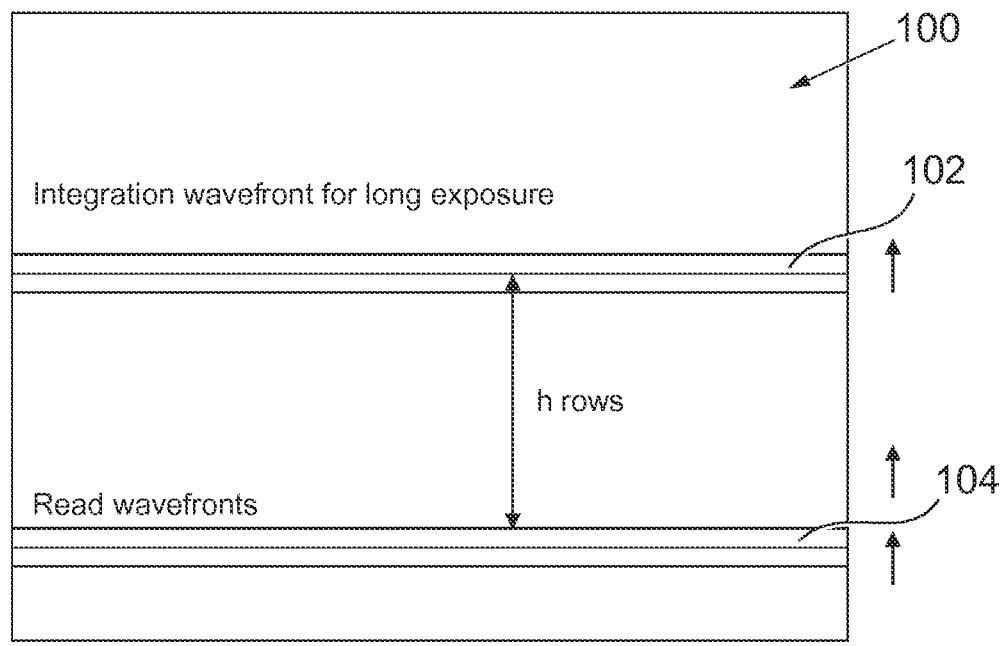
FIG. 1 illustrates a known principle of a rolling blade exposure for a digital image sensor.

FIG. 1 shows a typical "rolling blade" exposure system as implemented in a CMOS image sensor. A pixel array 100 comprises a number of rows of pixels. FIG. 1 shows a snapshot in time where a first row 102 of pixels is being reset (that is, the integration period for row 102 is just about to begin), and a second row 104 of pixels is being read out.

Once the reset and read operations for rows 102, 104 are complete, the upper (or lower, depending on the direction of the scanning of the pixel array) neighboring rows are then reset or read. In this way, reset and read "wavefronts" move across the pixel array 100. The gap between the reset and read wavefronts is a fixed number of rows. The wavefronts advance at a constant line rate, dependent on the desired frame rate and number of rows in the image. When a wavefront reaches the top or bottom row of the pixel array, it then starts again from the other end. The wavefronts thus roll round the pixel array at a certain exposure spacing, and hence this scheme is known as a "rolling blade". The exposure time, expressed in terms of the number of rows between the wavefronts, is generally adjusted as a function of the amount of light in the scene in order to maintain the mean pixel value in the centre of the output range.

Such an exposure scheme provides a linear representation of the light level in the scene, provided that the output of the pixel and readout circuitry is also linear. Typical CMOS pixels such as passive, active or pinned photodiode pixels all provide a linear conversion of input photons to output voltage.

The number of gathered photons is directly related to the length of exposure time. A linear readout chain and analog to digital converter is usually employed to convert the pixel output voltage to digital image codes.

Figure 2:
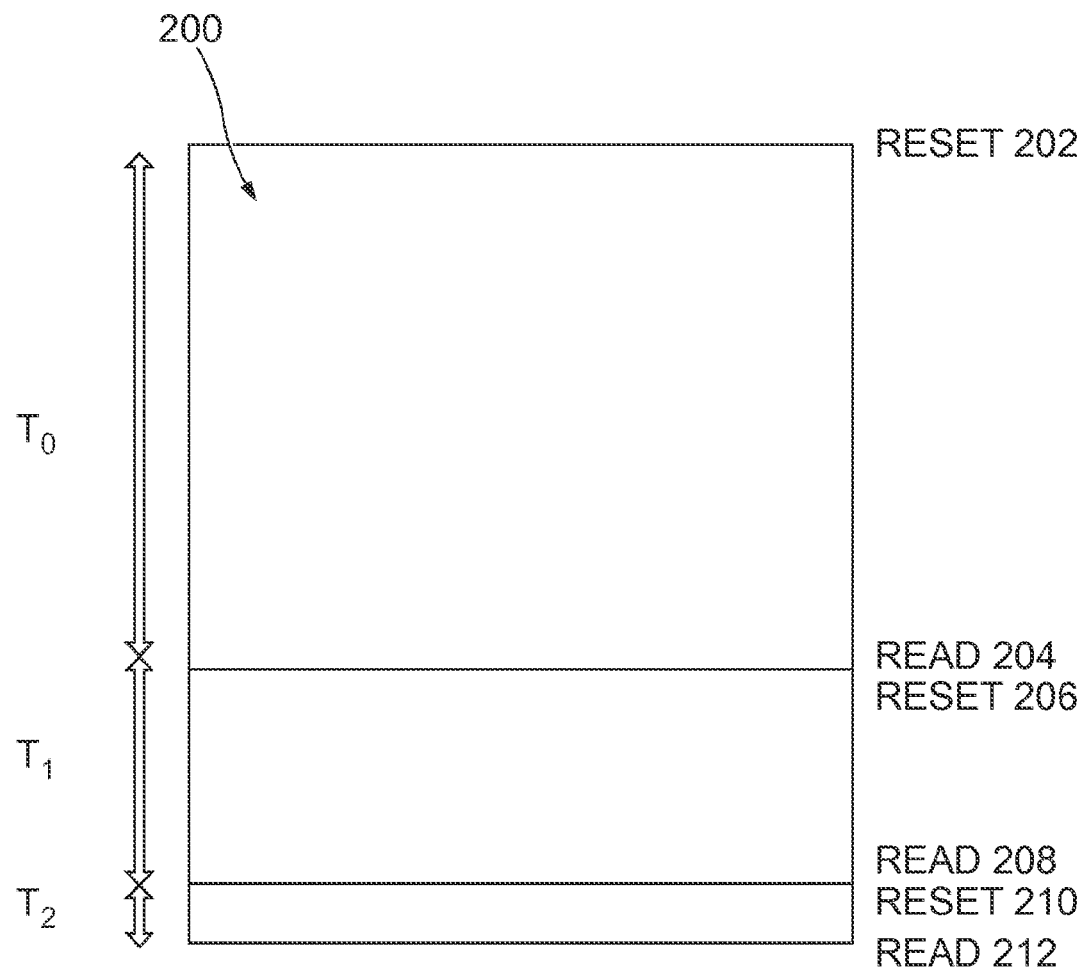
FIG. 2 illustrates a known method of multiple exposures for increasing dynamic range.

It is known to improve on the dynamic range by using multiple exposures, each with different integration times. FIG. 2 illustrates the basic principle of such an arrangement. A pixel array 200 has pixels arranged in rows. FIG. 2 shows a snapshot in time where pixel rows 202, 206, and 210 are being reset and pixel rows 204, 208 and 212 are being read out. The number of rows between each pair of reset and read wavefronts ({202, 204}, {206, 208} and {210, 212}) define different integration times (exposures) $T_0$, $T_1$ and $T_2$.

The number of rows for each integration period can optionally be set as fixed multiples of each other. For example, the multiple may be twenty, and an example implementation for that multiple may be $T_0$=800 rows (suitable for a relatively low light level); $T_1$=40 rows (suitable for a relatively intermediate light level) and $T_2$=two rows (suitable for a high light level).

According to this solution, three full readouts are required per row, and separate sets of full image data for at least two different exposure readouts must be stored in memory. In the example mentioned above, it is required to store data from the integration times $T_1$ and $T_2$ (forty-two lines) in line memory buffers. Data from the $T_0$ integration period is read out and compared with the data stored in the line memory buffers from the other exposures to generate an output value Of course, having three integration periods is just an example. Multiple exposure methods can have different numbers of different integration times, for example, two, or more than three. In any event, where there are multiple exposure times, all of the exposures except one must be stored in memory.

Figure 3:
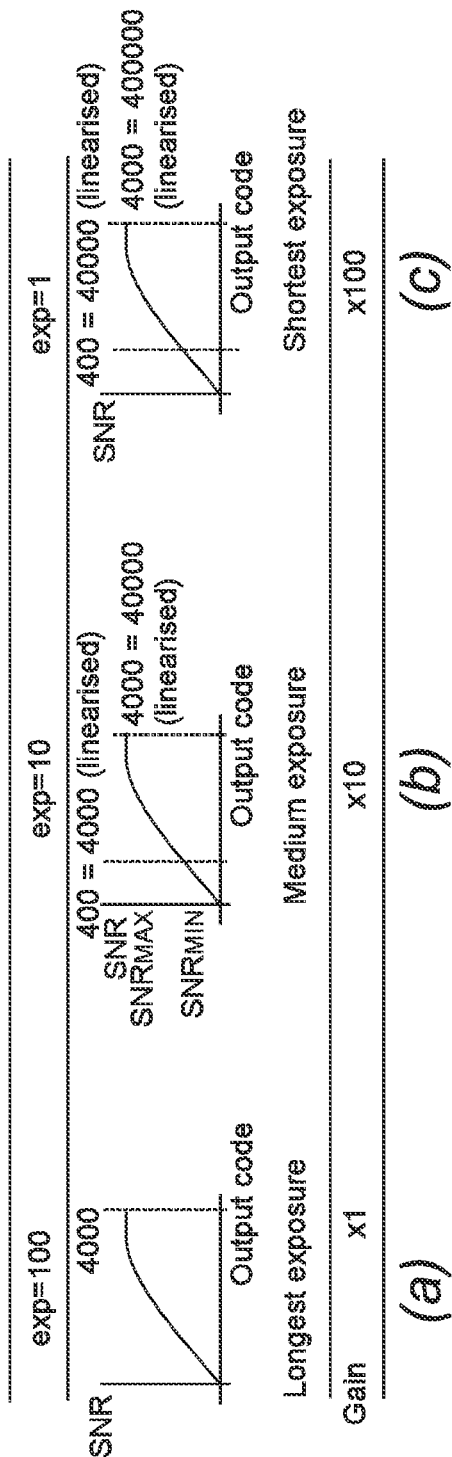
FIG. 3 is a sketch illustrating a variation of signal to noise ratio versus signal for the multiple exposures technique illustrated at FIG. 2.

FIG. 3 illustrates aspects of the operation of the scheme shown in FIG. 2. The variation of signal-to-noise ratio (SNR) with the output codes (that is, the raw digital count that is output by the pixel readout circuitry) is shown in each of FIGS. 3a, 3b and 3c, which illustrate a long exposure (100 arbitrary units (AU)), an intermediate exposure (10 AU) and a short exposure (1 AU) respectively. In order to linearize the readings derived from the output codes, the output codes are multiplied by a gain factor, which, following the arbitrary unit convention mentioned above, would be a gain factor of 1, 10, and 100 for the exposures illustrated in FIGS. 3a, 3b and 3c. The shape of the SNR to output code curve will be generally the same for each of the different exposures—the shape of the curve is largely determined by pixel photon shot noise.

Continuing to use arbitrary values for illustrative purposes, we consider the first, longest, exposure, of FIG. 3a. At some point, represented here by an arbitrary code value of 4000, the SNR reach a maximum permissible value, SNR_MAX, beyond which the signal overwhelms the pixel and it will saturate. However, an output code of 4000 for the exposure of FIG. 3a will correspond to an output code of 400 for the exposure of FIG. 3b, which has a lower SNR value, SNR_MIN, for that shorter exposure. So, the maximum permissible SNR value SNR_MAX on the first exposure curve effectively represents a knee point at which the longest exposure becomes unsuitable for use, and the image data should be derived from the next, intermediate, exposure, for correct determination of the pixel value.

This intermediate exposure will again have the same maximum permissible SNR value, which occurs at the same pre-linearization output code of 4000 AU, and which acts as the knee point at which the intermediate exposure becomes unsuitable for use, and the image data should be derived from the next, shortest, exposure, for correct determination of the pixel value.

Because the shape of the SNR to output code curve is the same for each of the different exposures, the values of SNR_MAX and SNR_MIN will be the same for each of the exposure curves.

In this way, the longest exposure (FIG. 3a) is suitable for reading the linearized pixel values from 0 (or the minimum possible value) to 4000 AU; the intermediate exposure (FIG. 3b) is suitable for reading the linearized pixel values from 4000 to 40000 AU; and the shortest exposure (FIG. 3c) is suitable for reading the linearized pixel values from 40000 AU to 400000 AU.

Figure 4:
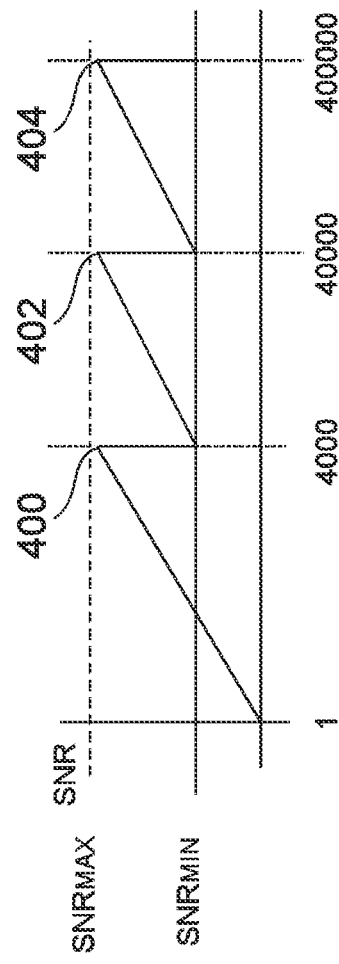
FIG. 4 shows the variation of a signal to noise ratio with exposure for the signals shown in FIG. 3 after scaling and combination.

FIG. 4 illustrates the extension of dynamic range that is achieved by this method. The SNR is plotted against the relinearized code values, following the same arbitrary unit convention mentioned above. The knee points 400, 402, 404 represent the transitions between the various exposures as explained with reference to FIG. 3. Effectively, the range of SNR values between SNR_MIN and SNR_MAX represents a range of values for which correct pixel value readout can be achieved. It can be seen that the exposure of FIG. 3a by itself would only be suitable for imaging incident radiation having an intensity represented by relinearized codes of up to 4000 AU. However, by using the additional exposures, the dynamic range can be extended, as codes with larger values can be imaged with the other exposures.

Figure 5:
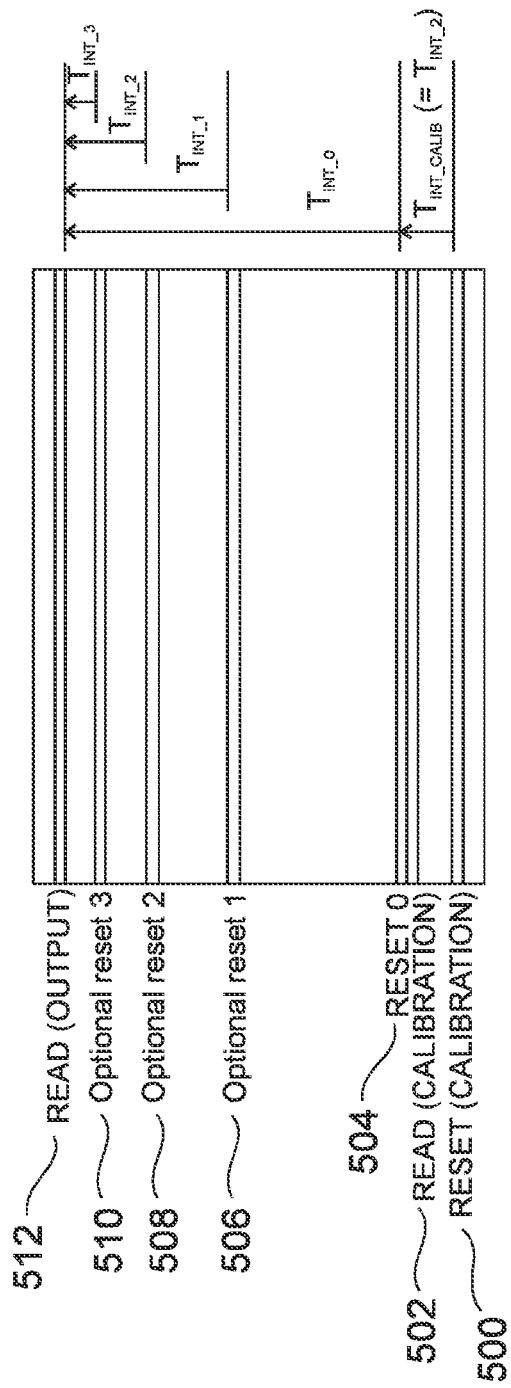
FIG. 5 shows an embodiment of a multiple exposure high dynamic range method according to the present disclosure.

FIG. 5 illustrates an alternative readout scheme, according to an aspect of the present disclosure. According to this scheme, an initial reset operation 500 is performed, followed by a first read operation 502. The initial reset and first read operations 500, 502 are separated by an integration time T_INT_CALIB. This initial integration time is used for a calibration measurement. The value of the code read out during this initial integration time (or "calibration time") forms calibration data that can be used as an indicator for setting the subsequent exposure period to be used for that pixel.

Following the calibration read 502, a reset 504 is performed. Following this reset is a final read operation 512. Before this final read operation 512, it is possible to perform other additional, optional, reset operations. In this case there are three available additional, optional, reset operations 506, 508, 510. The number and spacing of the optional reset operations may be varied according to the wishes of the designer. These additional available reset operations may correspond to preset predetermined integration periods which can be used following the selective operation of none or one of the additional optional reset operations 506, 508, 510.

The decision to selectively operate none or one of the additional optional reset operations 506, 508, 510, is based on the value of the calibration data that is read out at calibration read 502. Separate decision logic circuitry can be provided to take as its input the value of the calibration data and then output a control signal for the pixel circuitry based on the input calibration data. If the output code of the calibration read 502 yields a relatively low value, then decision logic circuitry can be set to ignore all of the optional resets 506, 508, 510 and use the longest available integration period T_INT_0 for the rest of the array. If, on the other hand, the value read out at the calibration rate is relatively high, the decision logic may enable the last available optional reset 510, setting the shortest possible exposure time for use in the array. The decision logic may be calibrated to enable one of the other optional reset values depending upon the value read out at 502.

The decision logic circuitry can be calibrated with appropriate thresholds for making these decisions. As an example, if the decision readout of a pixel showed a very low output value, then a long exposure would be applied to that pixel so a larger signal could be output for the video data, therefore improving the SNR performance.

The choice of the additional optional reset operations (that is, the exposure levels) to be applied can be stored as "decision data". In the example shown in FIG. 5, there are four available options (that is, using no additional optional reset, or using any one of the three available optional resets), so the decision data only needs to be two bits.

In order to control the calibration of the pixels in the array, the actual calibration data that is read out at READ 502 does not need to be stored. The decision logic circuitry processes it to make the decision in order to control the exposures, but subsequent to that decision being made, the actual calibration values that are read out can be discarded and exposure can be controlled on the basis of the decision data alone.

Performing an initial calibration read in this way means that it is no longer necessary to perform a full readout for each row for each of the different exposure times, and it is no longer required to store full image data for the length of the second longest exposure and for multiple exposure times in memory. Instead, it is required only to readout and store the decision data, together with only one full readout per row.

Figure 6:
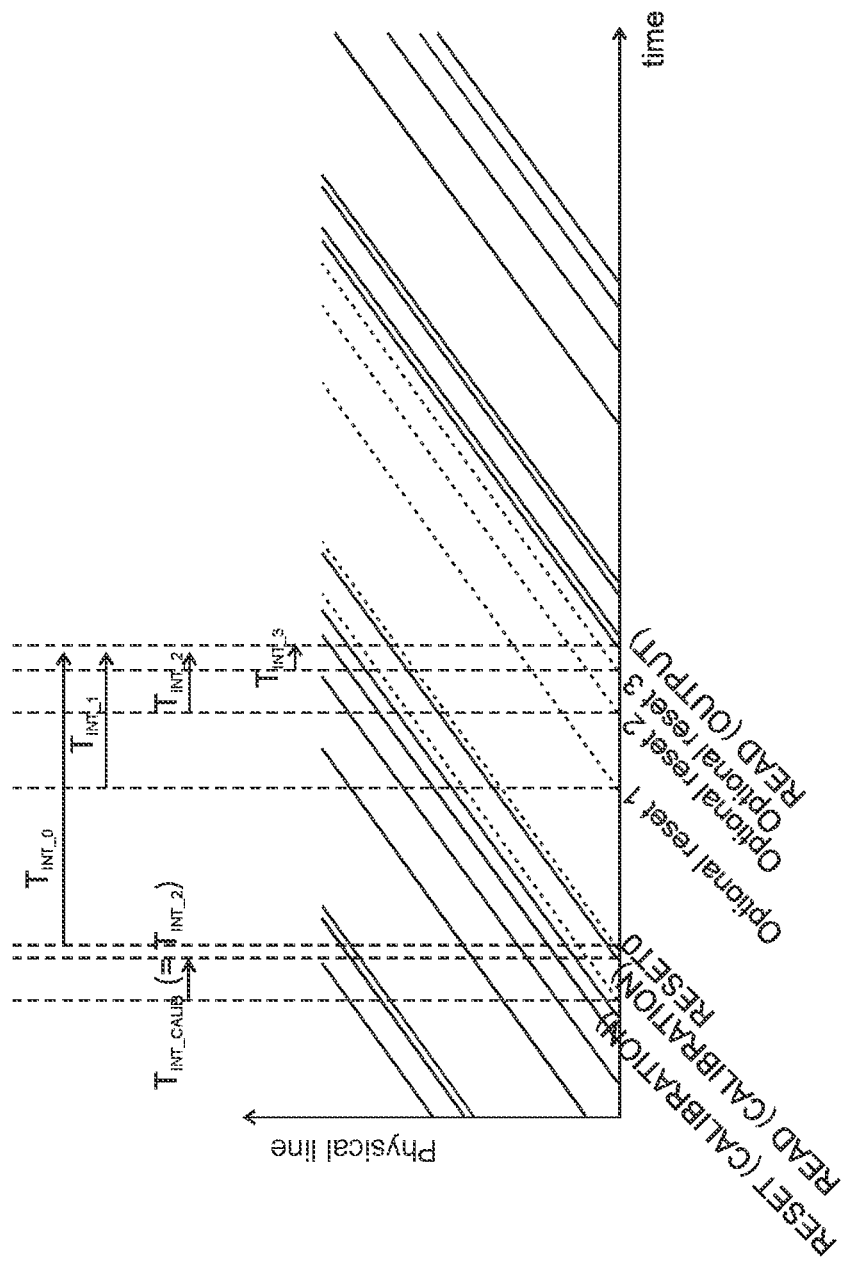
FIG. 6 shows the frame timing wave fronts associated with the method illustrated in FIG. 5.

FIG. 6 illustrates the frame timing wave fronts corresponding to the schematic shown in FIG. 5. The various operations are illustrated as wave fronts on the diagram, showing how they progress across physical lines of the pixel array over time. The timings illustrated in FIG. 6 will be repeated as successive frames are read out.

The method may be further enhanced by using both the vertical and horizontal addressing of pixels being read out, so that different pixels belonging to the same row can have different exposure times. According to this embodiment, a decision is made at the time of the calibration readout 502 for each pixel in the row, and this decision is stored in memory. Therefore, if one pixel of the row yields a relatively high value, a short exposure time can be set for the other pixels in the column to which that pixel belongs, while simultaneously, if another pixel of the same row yields a relatively low value, a long exposure time can be set for the other pixels in the column to which that pixel belongs. That is, each of the optional additional resets 506, 508, 510 can be applied selectively to individual pixels of each row, rather than needing to be applied across the whole rows. The read wavefront 512 is still applied to all pixels in each row as the wavefront progresses, but due to the preceding column-wise selectivity of the additional optional resets, the pixels in the row can have different exposures if needed.

In a further embodiment, the decision data can be low-pass filtered across the array. This can in some cases help improve the robustness of the image detection, for example it could prevent a moving car headlight outputting a very low value.

As mentioned above, storing decision data for controlling the exposure is more memory efficient that storing the actual raw calibration data that is read out during the calibration step. When both vertical and horizontal pixel addressing is used, it is possible to obtain further memory efficiencies by storing only the change in decision data across the row. That is, instead of having to store a separate decision data for each individual pixel in a row, an initial decision data could be stored, which would be applied to successive pixels along the row until a change occurs, and so on, until the end of the row. This can optionally be applied as an additional feature when the low pass filtering mentioned above is employed.

In a further optional embodiment, data from the calibration readout can be used to correct image data from a preceding frame of video readout data. In some cases, image data can be corrupted as a result of movement or light flicker in the image (for example, LED car headlights, which may need to be detected by the sensor, can flicker at frequencies of around 100 Hz). If a light flashes on and off, it may be missed in the video conversion but picked up in the subsequent decision readout. This may be implemented using the decision data only. However in an alternative implementation the actual calibration data is used for comparison with the video data to improve the accuracy of the correction applied.

The present disclosure provides modified pixel designs to enable the horizontal and vertical addressing.

Figure 7:
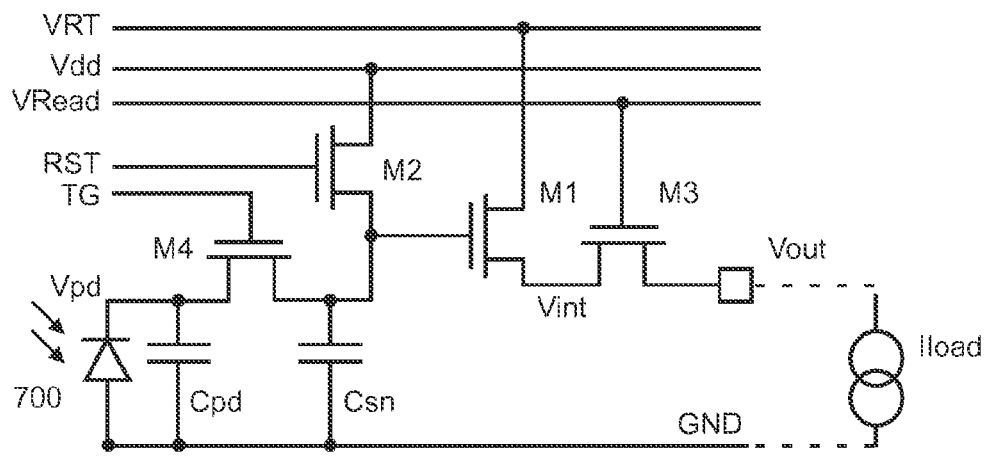
FIG. 7 shows a first example pixel structure for implementing pixel addressing in a readout operation.

There are various known pixel architectures, and FIG. 7 shows a four transistor (4T) pixel as an example. Radiation incident on a photoelectric conversion device (in this example a photodiode) 700 is isolated from the rest of the circuitry until a transfer gate transistor M4 is switched high. This "pinning" of the photodiode 700 means that the pixel operates with the lower dark current than a standard three transistor pixel. Operation of the pixel is then controlled via reset transistor M2, read transistor M3 and source follower (amplification) transistor M1.

To enable both vertical and horizontal addressing of the pixels, it is proposed to provide a modified pixel structure that uses multiple transistors to enable the pixel reset operation to be dependent on two input signals.

Figure 8:
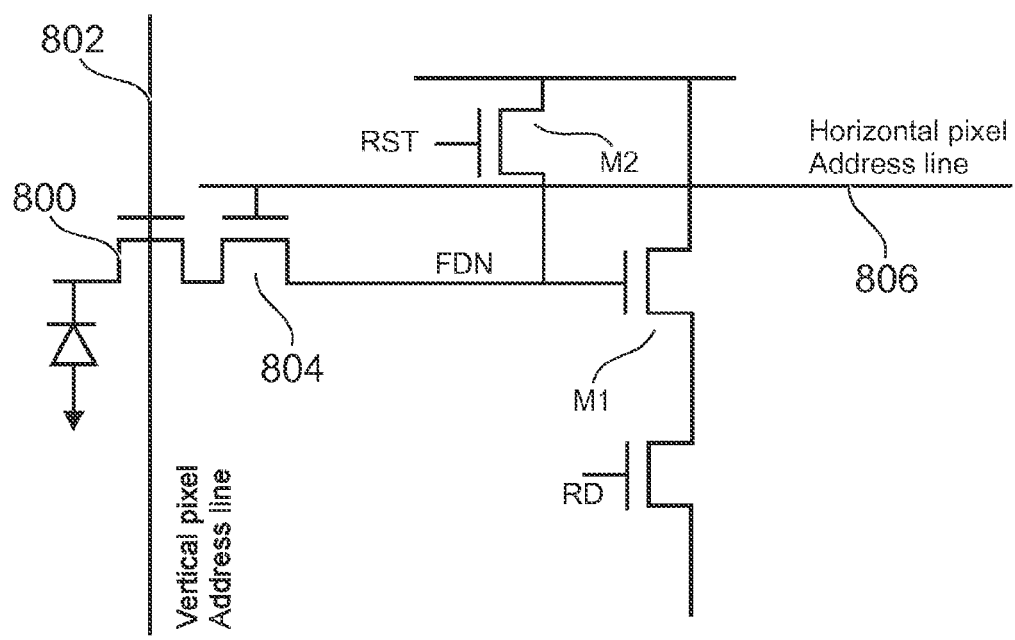
FIG. 8 shows a second example pixel structure for implementing pixel addressing in a readout operation.

FIG. 8 shows a first example implementation of this. A first transfer gate 800 is connected to a vertical pixel address line 802 while a second transfer gate 804 is connected to a horizontal pixel address line 806. Charge will be transferred from the pinned photodiode to the floating diffusion node only when both the vertical and horizontal address lines are driven high.

Figure 9:
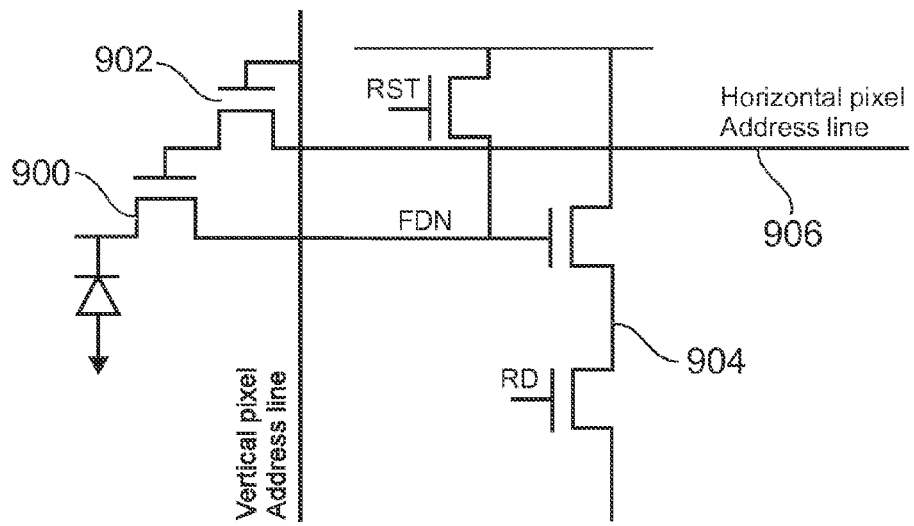
FIG. 9 illustrates aspects of the second example pixel structure shown in FIG. 8.

FIG. 9 illustrates an alternative pixel structure comprising first transfer gate 900 and second transfer gate 902. The second transfer gate 902 is connected at its gate to vertical address line 904 and at its drain to horizontal address line 906. If the vertical address line is pulled low then a reset pulse applied on the horizontal control line will not be passed to the gate of the Transfer Gate transistor. The gate of the Transfer Gate transistor is left to float for a short period. Clearly more complex logic could be implemented so this node never floats, but this would bring the disadvantage of requiring more transistors and, consequently, reduced sensitivity. This structure could be preferred to the structure of FIG. 8 in cases where charge pockets are formed on the nodes between the two transistor gates of the structure shown in FIG. 8.

Note that, with the previous two examples, it would be possible to swap the positions of the horizontal and vertical control lines while operating in a similar manner. It would also be possible to implement similar structures using PMOS transistors.

Figure 10:
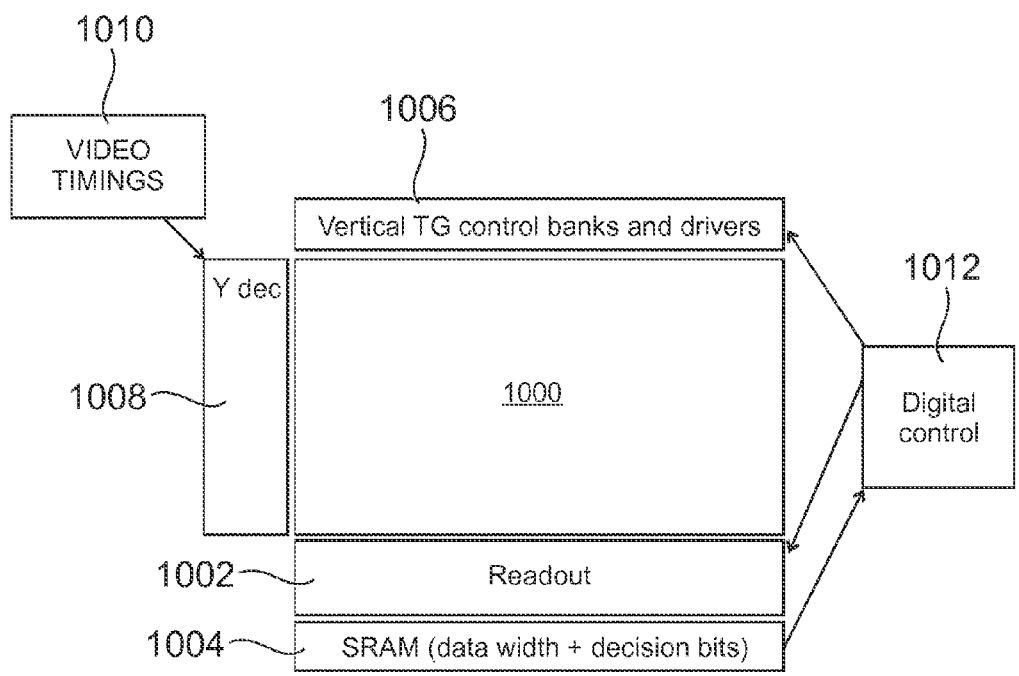
FIG. 10 illustrates an example implementation of an integrated circuit for implementing the aspects of the disclosure.

FIG. 10 illustrates an implementation aspect of the disclosure. According to this diagram a pixel array 1000 is provided with readout electronics 1002 and memory 1004, which in this embodiment is in the form of SRAM although it will be appreciated that other forms of readout technique and memory may be used as desired. Horizontal and vertical addressing circuitry 1006 and 1008 is provided for selectively applying control signals to apply the addressing of the transfer gates as mentioned above, as well as addressing of the other pixel transistors. Video timings 1010 are fed to the addressing circuitry (Y decoder) 1008. The contents of the memory 1004 are input to a digital controller 1012 that analyzes the contents of the memory and, based upon those contents, provides control signals to the horizontal addressing circuitry 1006. Individual pixels in the array 1000 are, therefore, vertically addressed by the video timings and horizontally addressed by the digital control, so that, as described above, different exposure times can be set for different pixels in the array and within each row.

Figure 11:
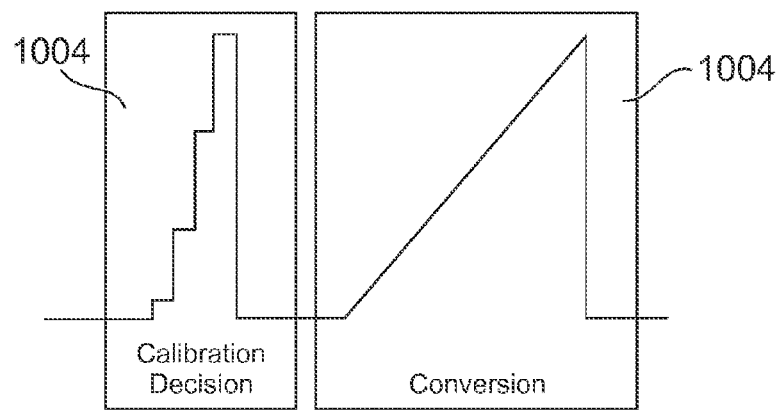
FIG. 11 shows an example implementation where a ramp for performing the calibration decision is compressed/stepped.

FIG. 11 shows the timing of the digital to analog converter (DAC) ramps that can be applied in a calibration decision 1100 and conversion process 1102, according to one embodiment. The calibration decision and the conversion occur for different physical lines. The calibration decision may be performed in steps in order to perform the decision within a shorter time period. It is noted that optional resets can occur in parallel with the readout.

Figure 12:
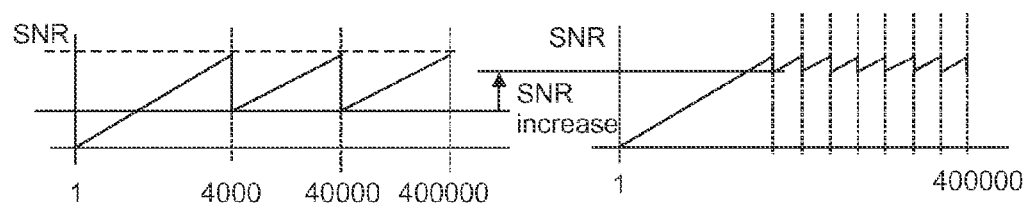
FIG. 12 is a sketch illustrating a comparison between the variation of a signal to noise ratio with exposure of a prior art imaging technique as illustrated in FIG. 4 (on the left hand side of the diagram), with a new technique in accordance with an embodiment of the present disclosure (on the right hand side of the diagram)

This scheme described above provides important advantages with respect to the prior art. First of all, for a given amount of available memory, the number of available knee points can be increased, which means that the signal to noise ratio can be improved. FIG. 12 illustrates this principle. The left hand side of FIG. 12 shows the three knee point readout scheme shown in FIG. 4 while the right hand side of FIG. 12 shows an eight knee point readout scheme, having the same overall dynamic range as the scheme previously illustrated, that is, providing exposures covering a range of codes up until 400,000. It can be seen from FIG. 12 that, because of the increased number of knee points, there is an effective increase in SNR. According to the prior art multiple exposure scheme, the provision of eight knee points would require the storage of full image output data for the sum of the seven shortest exposure lengths which represents a very high memory cost that would in practice be prohibitive. Additionally, the prior art would require eight full readouts to occur within one line time, which becomes prohibitive as required frame rates increase and consequently line times decrease.

In addition to the main function of controlling the exposure as mentioned above, the decision data derived from the calibration data can be used to control the gain of the read out. This can help achieve improved dynamic range in cases where the read out noise arising from the analog to digital conversion process is significant.

There may be further memory savings if assumptions are encoded regarding the light levels of pixels within the scene. If we can assume that the light level of a pixel will not change significantly with respect to its neighbors, then it may be possible to reduce memory requirements by compressing the data. For example, a memory location could determine that the next pixel should have increased exposure by one step, reduced exposure by one step, or the same exposure setting. Or, one memory location could store an exposure setting to be used by a group of pixels. Of course, more sophisticated compression techniques can be used. These may depend upon the application area of the sensors. For example, the sensor used in a machine vision application for industrial inspection of components can use assumptions about what a typical scene might look like in order to apply such compression techniques.

Figure 13:
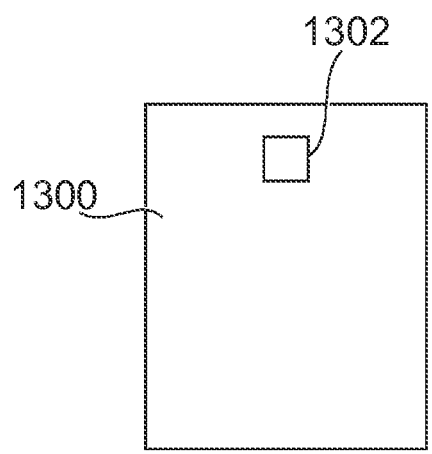
FIG. 13 illustrates a device incorporating an image sensor integrated circuit according to the aspects of the present disclosure.

FIG. 13 illustrates a device 1300 incorporating an image sensor integrated circuit 1302 according to the aspects of the present disclosure. Given the teaching above, the person skilled in the art will readily appreciate how to incorporate the readout scheme as part of various different devices. The device 1300 may be for example, and without limitation: a camera forming part of a closed-circuit television or other security monitoring system; inspection apparatus used in a manufacturing context for product quality control or other inspection purposes, an industrial tool for monitoring performance of mechanical components or detection of events.

Figure 14:
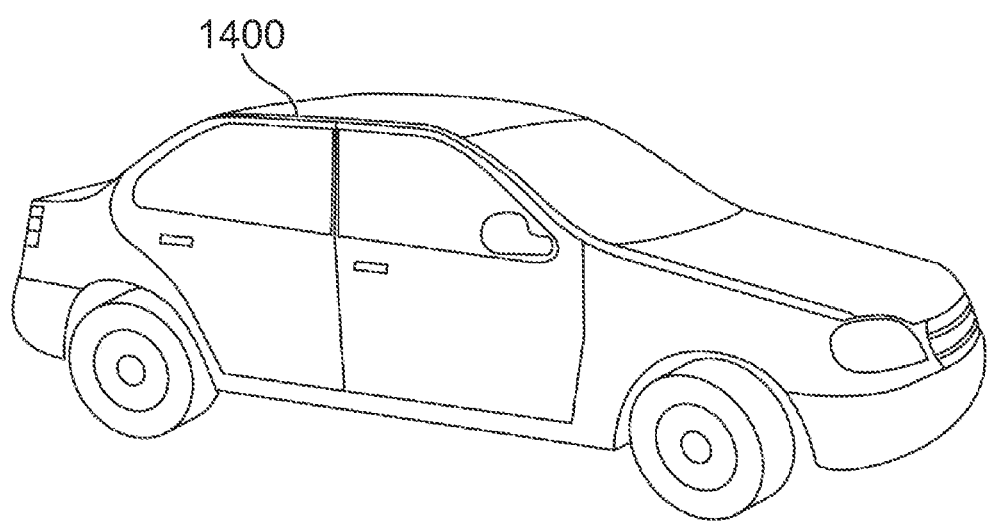
FIG. 14 illustrates a vehicle incorporating an image sensor according to the present disclosure.

FIG. 14 illustrates a vehicle incorporating an image sensor according to the present disclosure. As described above, the image sensor can be incorporated into any type of vehicle. An automobile is illustrated here but the vehicle could be any other type of vehicle such as a bus or truck; as well as a non-motorized vehicle.

Figure 15:
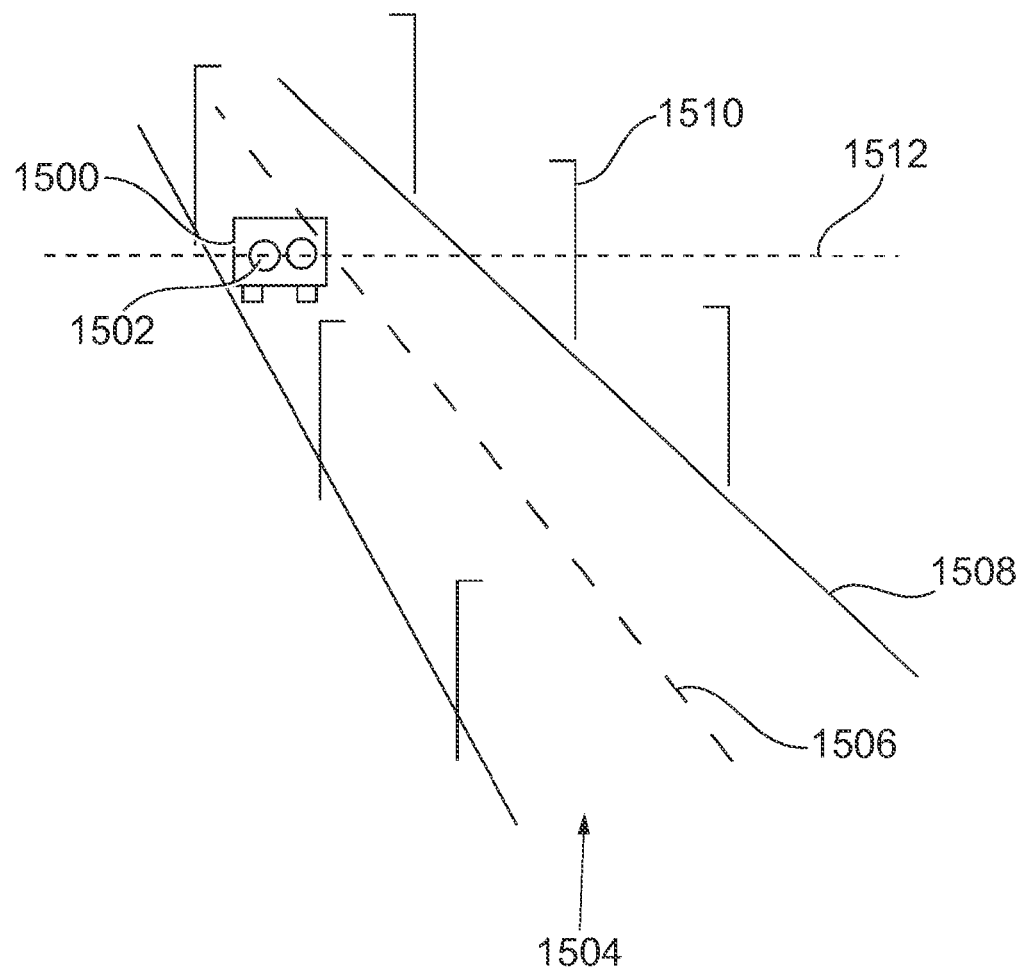
FIG. 15 illustrates an aspect of the use of the disclosure in a vehicle such as that shown in FIG. 14.

FIG. 15 illustrates an example case in the automotive field where the disclosure may be applied. In this example an image sensor is provided as part of a car and is positioned in a forward facing fashion (for example, mounted within the car's headlight cluster or on the front of the rear view mirror). The scene in FIG. 15 shows the view that is seen by the image sensor, and is occurring in the dark. In the view, there is an approaching vehicle 1500 with headlights 1502. The vehicle is travelling along a road 1504 which has centerline 1506 and side lines 1508. In addition, the road is flanked with streetlights 1510. It can be seen that, considering an example row 1512 within the image, there will be widely varying luminance intensities incident on the pixel array of the image sensor due to the variations in the scene. In this example, the headlights 1502 require a very short integration time, however the road sidelines 1508 require a longer integration time because that part of the road is very much darker than the headlights.

Various improvements and modifications may be made to the above without departing from the scope of the disclosure.

What is claimed is:

1. A method of imaging a scene with a digital image sensor comprising a pixel array, comprising the steps of:
   performing a reset operation across one row of the pixel array;
   integrating pixels in said row for a first calibration time;
   at the end of said first calibration time, reading pixel values of said row of pixels;
   comparing said pixel values with one or more predetermined thresholds; and
   setting subsequent exposure levels for pixels in the pixel array based upon said compared pixel values.

2. The method of claim 1, wherein setting subsequent exposure levels for pixels in the pixel array comprises controlling a timing of reset signals applied to individual pixels by vertically and horizontally addressing the pixels in the pixel array.

3. The method of claim 1, wherein comparing said pixel values with one or more predetermined thresholds comprises comparing the pixel values with the values of a DAC ramp, and stepping values of said DAC ramp according to the one or more predetermined thresholds.

4. The method of claim 1, further comprising storing as decision data the exposure levels which are set for pixels in the pixel array based upon said pixel values read out at the end of said calibration time.

5. The method of claim 4, wherein said decision data is used to control the gain of an analog readout circuit.

6. The method of claim 4, further comprising applying low pass filtering to successive decision data.

7. The method of claim 4, wherein storing comprises storing only changes in decision data that apply from one pixel to another.

8. A digital image sensor, comprising:
a pixel array; and
control circuitry arranged to:
perform a reset operation across one row of the pixel array;
integrate pixels in said row for a first calibration time;
at the end of said calibration time, read pixel values of said row of pixels;
compare said pixel values with one or more predetermined thresholds; and
set subsequent exposure levels for pixels in the pixel array based upon said pixel values.

9. The digital image sensor of claim 8, wherein pixels within the array have a structure that comprises a photoelectric conversion device connected to a transfer gate transistor which is operable to selectively connect the photoelectric conversion to or disconnect the photoelectric conversion from the remainder of the pixel circuitry.

10. The digital image sensor of claim 8, wherein pixels within the array comprise multiple transistors to enable the pixel transfer gate operation to be dependent upon two input signals.

11. The digital image sensor of claim 10, wherein a first transfer gate transistor is connected to a vertical pixel address line and a second transfer gate transistor is connected to a horizontal pixel address line, such that charge will be transferred from the pinned photodiode to the floating diffusion node only when both the vertical and horizontal address lines are driven high.

12. The digital image sensor of claim 10, wherein a first transfer gate transistor is connected at its gate to the source of a second transfer gate transistor, and said second transfer gate transistor is connected at its gate to a vertical address line and at its drain to a horizontal address line, so that if the vertical address line is pulled low then a reset pulse applied on the horizontal control line will not be passed to the gate of the first transistor.

13. A device comprising:
a digital image sensor comprising a pixel array and control circuitry arranged to:
perform a reset operation across one row of the pixel array;
integrate pixels in said row for a first calibration time;
at the end of said calibration time, read pixel values of said row of pixels;
compare said pixel values with one or more predetermined thresholds; and
set subsequent exposure levels for pixels in the pixel array based upon said pixel values.

14. A vehicle, comprising:
a digital image sensor comprising:
a pixel array; and
control circuitry arranged to:
perform a reset operation across one row of the pixel array;
integrate pixels in said row for a first calibration time;
at the end of said calibration time, read pixel values of said row of pixels;
compare said pixel values with one or more predetermined thresholds; and
set subsequent exposure levels for pixels in the pixel array based upon said pixel values.

* * * * *

UNITED STATES PATENT AND TRADEMARK OFFICE
CERTIFICATE OF CORRECTION

Page 1 of 1

PATENT NO. : 9,313,427 B2
APPLICATION NO. : 13/710981
DATED : April 12, 2016
INVENTOR(S) : John Kevin Moore et al.

It is certified that error appears in the above-identified patent and that said Letters Patent is hereby corrected as shown below:

On the Title Page:

Item (71) is missing one of the named Applicants and should be corrected as follows:

(71) Applicant: STMicroelectronics (Grenoble 2) SAS, Grenoble (FR); STMicroelectronics (Research & Development) Limited, Marlow, Buckinghamshire (GB)

Signed and Sealed this
Nineteenth Day of July, 2016

Michelle K. Lee
*Director of the United States Patent and Trademark Office*